(12) United States Patent
Kiesel et al.

(10) Patent No.: US 11,858,805 B2
(45) Date of Patent: Jan. 2, 2024

(54) MICROMECHANICAL STRUCTURE AND MICROMECHANICAL SENSOR

(71) Applicant: Robert Bosch GmbH, Stuttgart (DE)

(72) Inventors: Stefan Kiesel, Reutlingen (DE); Cristian Nagel, Reutlingen (DE); Sebastian Guenther, Tuebingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/447,002

(22) Filed: Sep. 7, 2021

(65) Prior Publication Data
US 2022/0073341 A1 Mar. 10, 2022

(30) Foreign Application Priority Data
Sep. 10, 2020 (DE) ................. 10 2020 211 362.9

(51) Int. Cl.
 *B81B 3/00* (2006.01)
 *G01P 15/08* (2006.01)
 *G01P 15/18* (2013.01)
 *G01P 15/125* (2006.01)

(52) U.S. Cl.
 CPC ........ *B81B 3/0021* (2013.01); *G01P 15/0802* (2013.01); *G01P 15/125* (2013.01); *G01P 15/18* (2013.01); *B81B 2201/0235* (2013.01); *G01P 2015/0862* (2013.01)

(58) Field of Classification Search
CPC .... G01P 15/125; G01P 15/18; G01P 15/0802; B81B 3/0051; B81B 3/007; B81B 3/0021
See application file for complete search history.

(56) References Cited

U.S. PATENT DOCUMENTS

| | | | |
|---|---|---|---|
| 2010/0281980 A1* | 11/2010 | Yazawa | G01P 15/0802 73/514.32 |
| 2012/0262026 A1 | 10/2012 | Lin et al. | |
| 2015/0268269 A1* | 9/2015 | Jia | G01P 15/125 73/514.32 |
| 2016/0097792 A1* | 4/2016 | Naumann | G01P 15/18 73/504.02 |

(Continued)

FOREIGN PATENT DOCUMENTS

DE 102008001442 A1 11/2009

*Primary Examiner* — Helen C Kwok
(74) *Attorney, Agent, or Firm* — NORTON ROSE FULBRIGHT US LLP; Gerard A. Messina

(57) ABSTRACT

A micromechanical structure, including a substrate, a seismic mass movable with respect to the substrate, and first and second detectors. A first direction and a second direction perpendicular to the first direction define a main extension plane of the substrate. The first and second detectors respectively detect a translatory deflection, and a rotatory deflection. The seismic mass is connected to the substrate via an anchoring element and four torsion spring sections. The first detector include an electrode structure, including first electrodes attached at the seismic mass and second electrodes attached at the substrate. The first and second electrodes have a two-dimensional extension in the second direction and in a third direction perpendicular to the main extension plane. The anchoring element includes first and second sections with a gap between them. A connecting element connects two first electrodes and is guided through the gap.

9 Claims, 6 Drawing Sheets

(56) References Cited

U.S. PATENT DOCUMENTS

| | | | |
|---|---|---|---|
| 2016/0169931 A1 | 6/2016 | Tocchio | |
| 2017/0023608 A1* | 1/2017 | Tang | G01P 15/18 |
| 2017/0052207 A1* | 2/2017 | Classen | G01P 15/125 |
| 2017/0184628 A1* | 6/2017 | Hsu | B81B 3/0072 |
| 2018/0120342 A1* | 5/2018 | Tocchio | G01P 15/097 |
| 2018/0275161 A1* | 9/2018 | Tang | G01P 15/125 |
| 2018/0292210 A1* | 10/2018 | Kihara | G01P 15/125 |
| 2019/0339078 A1* | 11/2019 | McNeil | G01P 15/18 |
| 2021/0072280 A1* | 3/2021 | Liukku | G01P 15/18 |
| 2021/0215735 A1* | 7/2021 | Tseng | G01P 1/00 |

* cited by examiner

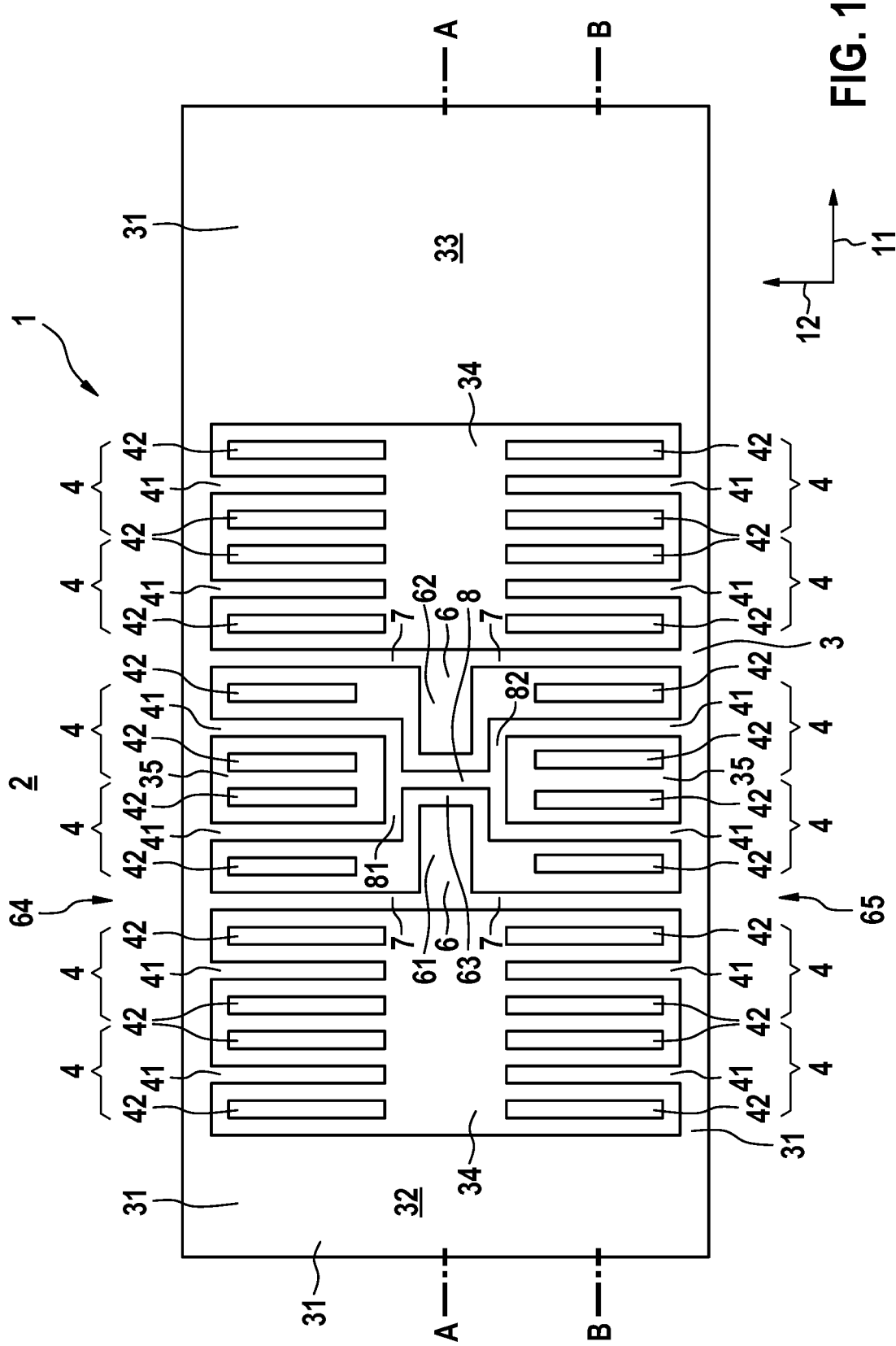

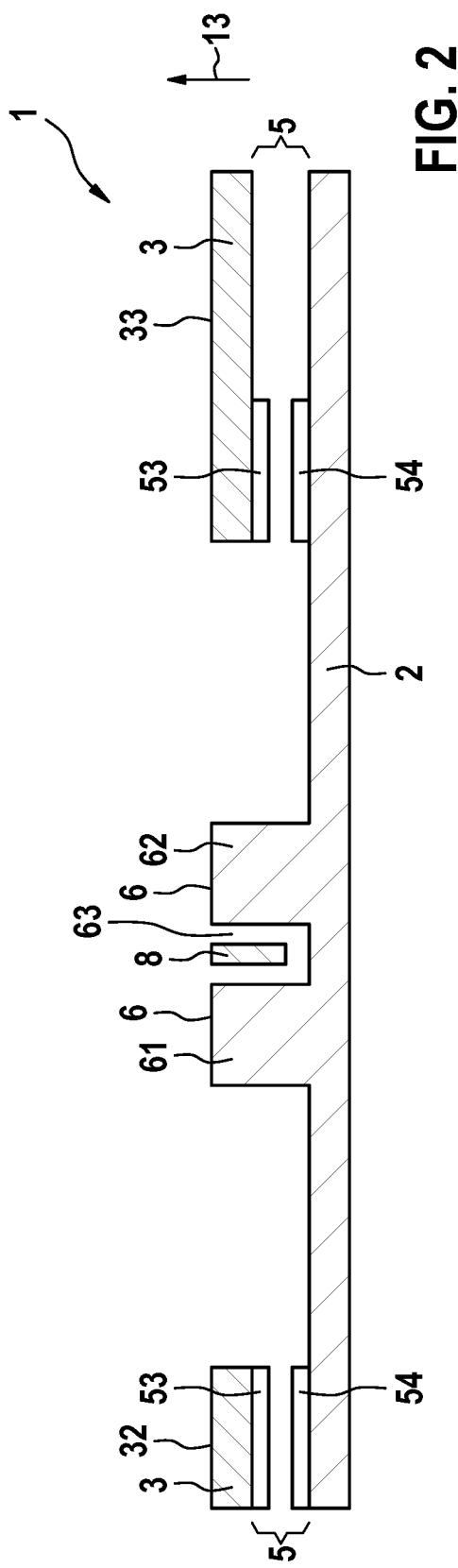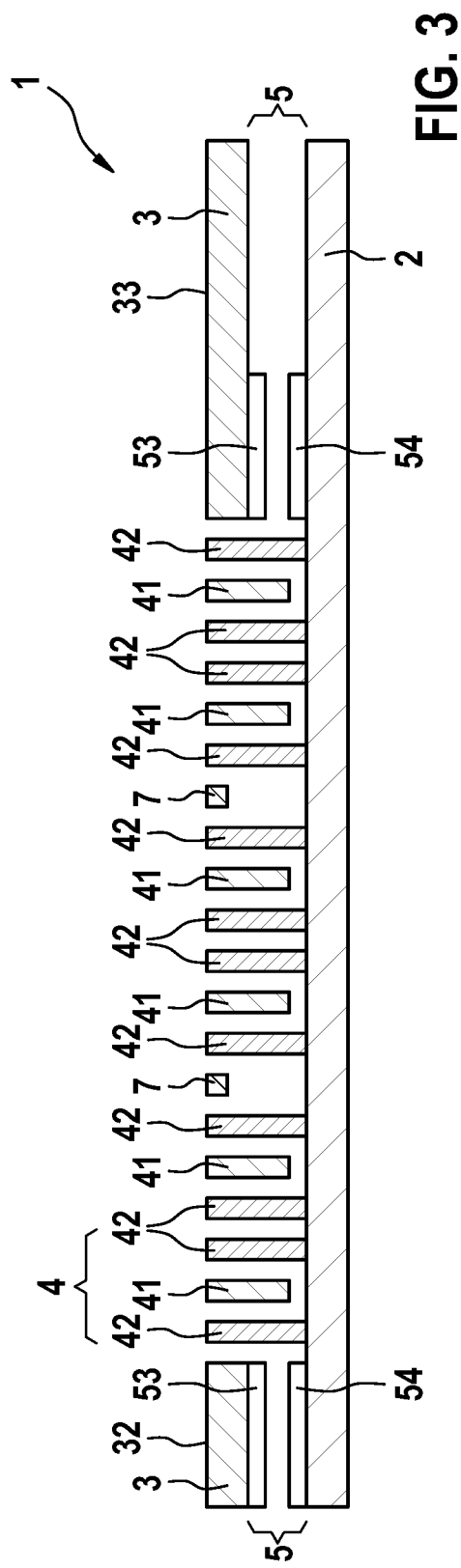

MICROMECHANICAL STRUCTURE AND MICROMECHANICAL SENSOR

FIELD

The present invention relates to a micromechanical structure and to a micromechanical sensor.

BACKGROUND INFORMATION

Micromechanical structures and micromechanical sensors are available in the related art. For example, a micromechanical sensor is described in German Patent Application No. DE 10 2008 001 442 A1, in which a translatory deflection of a seismic mass in a first direction may be determined with the aid of first detection means, and a rotatory deflection about a rotation axis parallel to a second direction of the seismic mass may be determined with the aid of second detection means, it thereby being possible to ascertain an acceleration of the micromechanical structure in the first direction and in a third direction, the three directions being orthogonal. The detection means include electrodes, which are each either situated at the seismic mass or at a substrate.

SUMMARY

It is an object of the present invention to provide an improved micromechanical structure in which the likelihood of a contact of electrodes of the detection means is reduced. It is another object of the present invention to provide a micromechanical sensor including such a micromechanical structure.

These objects may be achieved by example embodiments of the present invention. Advantageous refinements and embodiments of the present invention are disclosed herein.

A micromechanical structure includes a substrate and a seismic mass movable with respect to the substrate, as well as first detection means (i.e., a first detector) and second detection means (i.e., a second detector). A first direction and a second direction essentially perpendicular to the first direction define a main extension plane of the substrate. The first detection means are provided for detecting a translatory deflection of the seismic mass in the first direction. The second detection means are provided for detecting a rotatory deflection of the seismic mass about a rotation axis, the rotation axis being situated in the second direction. The seismic mass is connected to the substrate via an anchoring element and four torsion spring sections situated along the second direction. The first detection means include an electrode structure, including first electrodes attached at the seismic mass and second electrodes attached at the substrate. The first electrodes and second electrodes have an essentially two-dimensional extension in the second direction and in a third direction, the third direction being perpendicular to the main extension plane. The anchoring element includes a first section and a second section, a gap being situated between the first section and the second section. A connecting element connects two first electrodes, the connecting element being guided through the gap.

Improved mechanical stability of the first electrodes is achieved by the connecting element. In this way, an extended service life of the micromechanical structure is possible since a sensitivity of the first detection means is permanently reduced in the event of contact of a first electrode with one of the second electrodes caused by mechanical instability. An increased mechanical stability thus results in an enhanced service life.

The improved mechanical stability of the first electrodes is advantageous for the mechanical robustness, for example in the event of a mechanical overload and/or during a mechanically caused collapse. Moreover, the likelihood of an electrically caused collapse of the first and second electrodes is decreased by the connecting element. The likelihood for contact of the electrodes due to electrical attraction is thus reduced. Without the connecting element, a comparable mechanical stability could only be achieved with the aid of very thick first electrodes. As a result of the connecting element, mass and surface area may thus be saved, with the same mechanical robustness.

In one specific example embodiment of the micromechanical structure in accordance with the present invention, multiple first electrodes are situated on a first side of the anchoring element, and multiple first electrodes are situated on a second side of the anchoring element situated opposite the first side. A first transverse structure connects the first electrodes on the first side to the connecting element. A second transverse structure connects the first electrodes on the second side to the connecting element. In this way, the mechanical stability is further increased.

In one specific example embodiment of the micromechanical structure of the present invention, the connecting element includes at least one first elevation. In the area of the first elevation, a distance between the connecting element and the substrate is decreased compared to the distance between the connecting element and the substrate outside the first elevation. In this way, a mechanical striking of the connecting structure against the substrate may be reduced to the first elevation, and the mechanical stability of the micromechanical structure may thus also be increased. In this way, an extended service life of the micromechanical structure is possible.

In one specific example embodiment of the micromechanical structure of the present invention, the connecting element includes at least one second elevation. In the area of the second elevation, a distance between the connecting element and the anchoring element is decreased compared to the distance between the connecting element and the anchoring element outside the second elevation. In this way, a mechanical striking of the anchoring structure against the substrate may be reduced to the first elevation, and the mechanical stability of the micromechanical structure may thus also be increased.

The two aforementioned specific example embodiments may be combined. In this case, as above, the elevations may be referred to as first and second elevations. If only first elevations or only second elevations are provided, these may also in general be referred to as elevations.

In one specific example embodiment of the micromechanical structure of the present invention, the seismic mass includes a frame, the torsion spring sections abutting the frame and the anchoring element. The first electrodes abut the frame. This enables a further improvement of the mechanical stability of the micromechanical structure.

In one specific example embodiment of the micromechanical structure of the present invention, two outer areas and two inner areas are formed by the torsion spring sections, the anchoring element, and the frame. The outer areas are situated between the frame and two torsion spring sections in each case. The inner areas are in each case situated between two torsion spring sections, the frame, and the anchoring element. The connecting element connects first electrodes, which are each situated in one of the inner areas, to one another.

In one specific example embodiment of the micromechanical structure of the present invention, the frame has an asymmetrical mass distribution, based on the anchoring element and the torsion spring sections, in the first direction. This makes it possible to convert an acceleration of the seismic mass in the third direction into a rotatory deflection about the rotation axis.

In one specific example embodiment of the micromechanical structure of the present invention, the second detection means include a third electrode situated at the frame and a fourth electrode situated at the substrate. This enables a capacitive ascertainment of the deflection of the seismic mass about the rotation axis.

A micromechanical sensor includes the micromechanical structure and an electrical circuit for reading out the first detection means and the second detection means.

In one specific example embodiment of the micromechanical sensor of the present invention, the electrical circuit is configured to ascertain a first capacitance of a first capacitor formed of at least one first electrode and at least one second electrode, and a second capacitance of a second capacitor formed of at least one third electrode and at least one fourth electrode.

Exemplary embodiments of the present invention are described herein based on the figures.

BRIEF DESCRIPTION OF THE DRAWINGS

FIG. 1 shows a top view onto a micromechanical structure, in accordance with an example embodiment of the present invention.

FIG. 2 shows a cross-section of the micromechanical structure of FIG. 1.

FIG. 3 shows a further cross-section of the micromechanical structure of FIG. 1.

DETAILED DESCRIPTION OF EXAMPLE EMBODIMENTS

Figure 4:
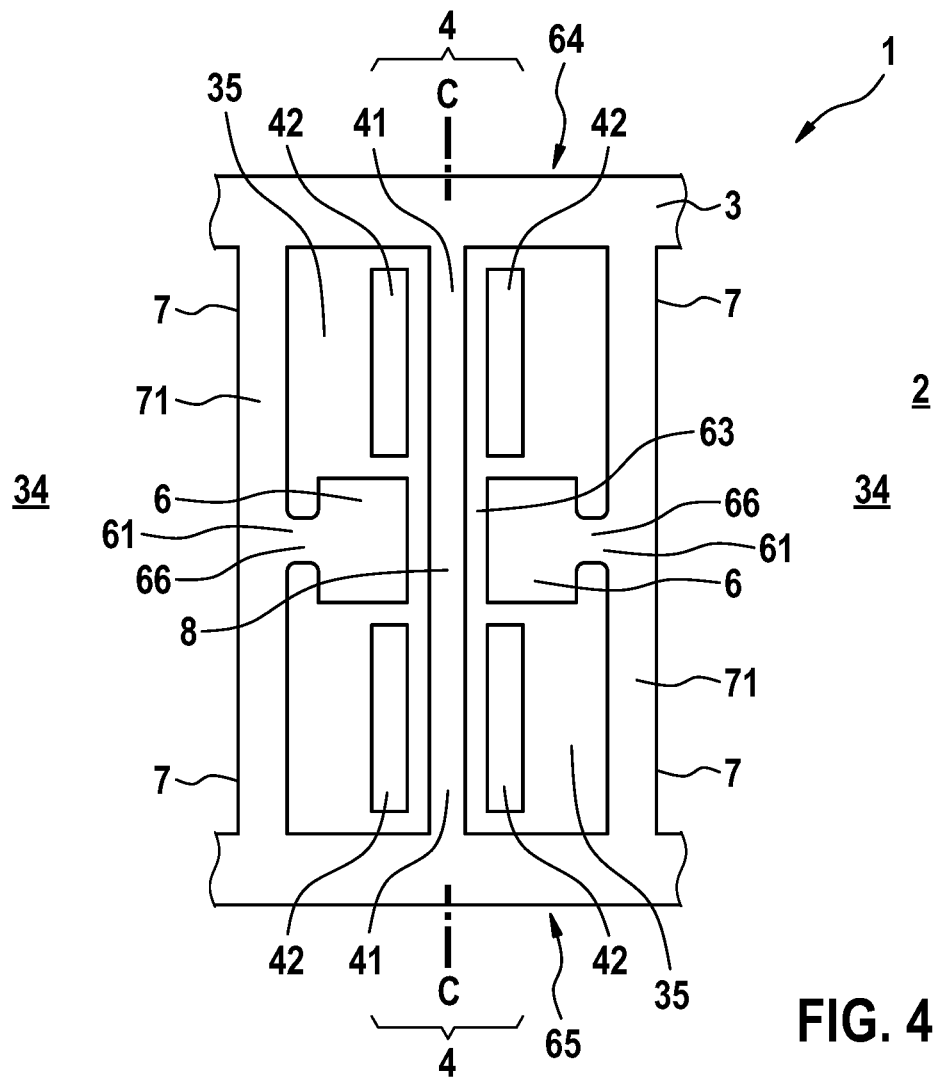
FIG. 4 shows a top view onto a further micromechanical structure, in accordance with an example embodiment of the present invention.

FIG. 1 shows a top view onto a micromechanical structure 1 made up of a substrate 2 and a seismic mass 3. FIG. 2 shows a cross-section through micromechanical structure 1 of FIG. 1 at the intersecting line denoted by A. FIG. 3 shows a cross-section through micromechanical structure 1 of FIG. 1 at the intersecting line denoted by B. The micromechanical structure is described hereafter based on FIGS. 1 through 3, it being possible that individual elements are not visible in all figures.

Micromechanical structure 1 includes first detection means (i.e., first detector) 4 and second detection means (i.e., second detector) 5. A first direction 11 and a second direction 12 define a main extension plane of the substrate, first direction 11 and second direction 12 being situated essentially perpendicularly on each other and, in particular, being perpendicular to one another. First detection 4 means are provided for detecting a translatory deflection of seismic mass 3 in first direction 11. Second detection means 5 are provided for detecting a rotatory deflection of seismic mass 3 about a rotation axis, the rotation axis being situated essentially in parallel to second direction 12, in particular, in parallel to second direction 12. Seismic mass 3 is connected to substrate 2 via an anchoring element 6 and four torsion spring sections 7. In the process, anchoring element 6 is connected to substrate 2 and torsion spring sections 7, and torsion spring sections 7 are connected to anchoring element 6 and seismic mass 3.

First detection means 4 include an electrode structure made up of first electrodes 41 and second electrodes 42, first electrodes 41 being attached at seismic mass 3 and second electrodes 42 being attached at the substrate. First electrodes 41 and second electrodes 42 have an essentially two-dimensional extension in second direction 12 and a third direction 13, third direction 13 being essentially perpendicular to the main extension plane. In other words, an extension of first electrodes 41 or second electrodes 42 in first direction 11 is small compared to an extension in second direction 12 or third direction 13.

Anchoring element 6 includes a first section 61 and a second section 62. A gap 63 is situated between first section 61 and section 62. A connecting element 8 connects two first electrodes 41 and is guided through the gap. Connecting element 8 enables an improved mechanical stability of the first electrodes connected by connecting element 8.

When seismic mass 3 is deflected in first direction 11 out of a rest position due to an acceleration in first direction 11 acting on seismic mass 3, first electrodes 41 connected to seismic mass 3 are displaced with respect to second electrodes 42 connected to substrate 2. This displacement may be detected as a change of a capacitance of a first capacitor formed by first electrodes 41 and second electrodes 42. A measure of the displacement is dependent on a first spring constant of torsion spring sections 7, the first spring constant indicating a measure of a deflection of torsion spring section 7 in first direction 11, based on a force acting on torsion spring sections 7.

The further features of micromechanical structure 1 described in FIGS. 1 through 3 are optional and represent preferred specific embodiments.

Two first electrodes 41 are situated on a first side 64 of anchoring element 6, and two first electrodes 41 are also situated on a second side 65 situated opposite first side 64. First electrodes 41 on first side 64 are connected to connecting element 8 with the aid of a first transverse structure 81. First electrodes 41 on second side 65 are connected to connecting element 8 with the aid of a second transverse structure 82. It may be provided that a number of first electrodes 41 deviating from FIGS. 1 through 3 is situated on first side 64 and second side 65.

Seismic mass 3 includes a frame 31. Torsion spring sections 7 abut frame 31 and anchoring element 6. First electrodes 41 abut the frame.

Two outer areas 34 and two inner areas 35 are formed by frame 31, anchoring element 6, and torsion spring sections 7. Outer areas 34 are situated between frame 31 and two torsion spring sections 7 in each case. Inner areas 35 are in each case situated between frame 31, two torsion spring sections 7, and anchoring element 6. Connecting element 8 connects first electrodes 41, which are each situated in one of inner areas 35, to one another. In particular, connecting element 8 connects all first electrodes 41 in one of inner areas 35 to all first electrodes 41 in the other inner area 35.

Frame 31 includes a first mass 32 and a second mass 33, which are each situated on the outside of seismic mass 3, based on first direction 11. Since second mass 33 is greater than first mass 32, an acceleration of micromechanical structure 3 in third direction 13 results in a rotation of seismic mass 3 about the rotation axis in parallel to second direction 12. As a result of first mass 32 and second mass 33, an asymmetrical mass distribution is given, which is necessary for this effect.

Second detection means 5 include third electrodes 53 situated at frame 31 and fourth electrodes 54 situated at substrate 2. When seismic mass 3 is deflected rotatorily about the rotation axis in parallel to second direction 12 out of a rest position due to an acceleration in third direction 13 acting on seismic mass 3, third electrodes 53 connected to seismic mass 3 or frame 31 are displaced with respect to fourth electrodes 54 connected to substrate 2. This displacement may be detected as a change of a capacitance of a first capacitor formed by third electrodes 53 and fourth electrodes 54. In the process, a measure of the displacement is dependent on a second spring constant of torsion spring sections 7, the second spring constant indicating a measure of a torsional stiffness of torsion spring sections 7. Instead of the shown second detection means 5, other second detection means 5 may also be provided, with the aid of which a rotatory deflection about the rotation axis in parallel to second axis 12 may be detected.

Two second electrodes 42 are assigned to each of first electrodes 41, so that always two second electrodes 42 and one first electrode 41 form part of a detection means 4. During a deflection in first direction 11, in each detection means the plate distance of a first capacitor, formed of first electrode 41 and one of the second electrodes 42, is reduced, while the plate distance of a further first capacitor, formed of first electrode 41 and the other of second electrodes 42, is increased.

FIG. 4 shows a top view onto a section of a further micromechanical structure 1, which corresponds to micromechanical structure 1 of FIGS. 1 through 3, unless differences are described hereafter. In particular, inner areas 35 are shown in FIG. 4. In outer areas 34, micromechanical structure 1 may, in particular, be identical to micromechanical structure 1 of FIGS. 1 through 3. In inner areas 35, only one first electrode 41 and two second electrodes 42 are in each case situated on first side 64 and second side 65. Connecting element 8 connects first electrodes 41. Since only one first electrode 41 is situated in each of inner areas 35, no transverse structures 81, 82 are provided.

In the area in which sections 61, 62 of anchoring element 6 are connected to torsion spring sections 7, anchoring element 6 includes a respective taper 66. It may be provided that anchoring elements 6, in the area of taper 66, are not guided up to substrate 2 in third direction 13, so that the two torsion spring sections 7, which abut first section 61, and the two torsion spring sections 7, which abut second section 62, in each case form a continuous torsion spring 71.

These two embodiments of micromechanical structure 1 of FIG. 4 may also be provided independently of one another in the micromechanical structure of FIGS. 1 through 3.

Figure 5:
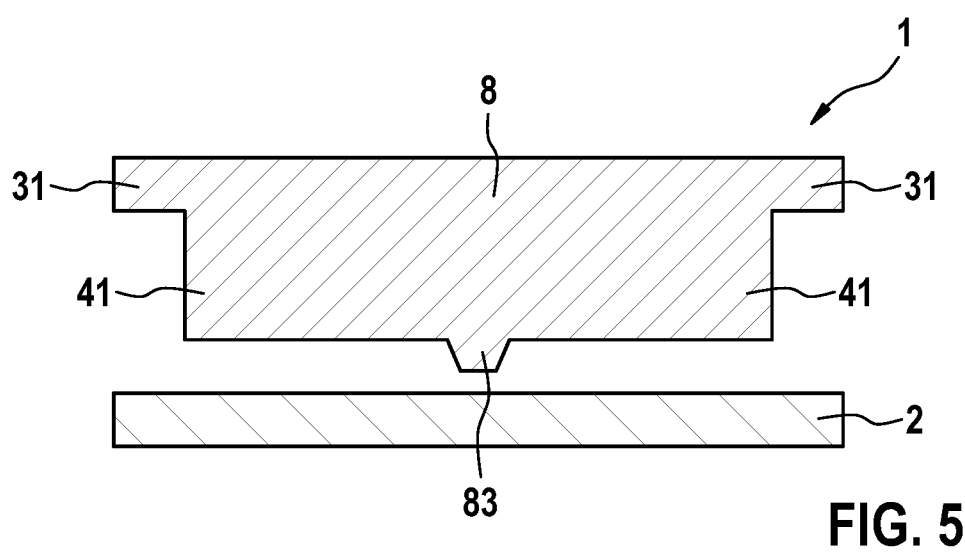
FIG. 5 shows a cross-section of the micromechanical structure of FIG. 4.

FIG. 5 shows a cross-section through micromechanical structure 1 of FIG. 4 at the intersecting line through connecting element 8 denoted in FIG. 4 by C. Connecting element 8 includes a first elevation 83. The first elevation is situated between connecting element 8 and substrate 2. As a result of first elevation 83, a distance between substrate 2 and connecting element 8 is decreased, compared to areas outside first elevation 83. First elevation 83 is used to prevent seismic mass 3 from striking against substrate 2, or at least make it more difficult, if seismic mass 3 is moved in third direction 13 toward substrate 2 due to a force acting on micromechanical structure 1. In particular, a planar striking of connecting element 8 against substrate 2 is to be prevented or at least made more difficult.

In contrast to the representation of FIG. 5, it is also possible for multiple first elevations 83 to be provided. An embodiment identical to first elevation 83 of FIG. 5 may also be provided in micromechanical structure 1 of FIGS. 1 through 3. In this case, it may also be provided to situate one or multiple first elevation(s) 83 at first transverse structure 81 or second transverse structure 82, in addition or as an alternative to first elevation 83 shown in FIG. 5.

In contrast to the representation of FIG. 5, frame 31 may also be configured in such a way that frame 31 has the same extension in third direction 13 as first electrodes 41.

Figures 6, 7:
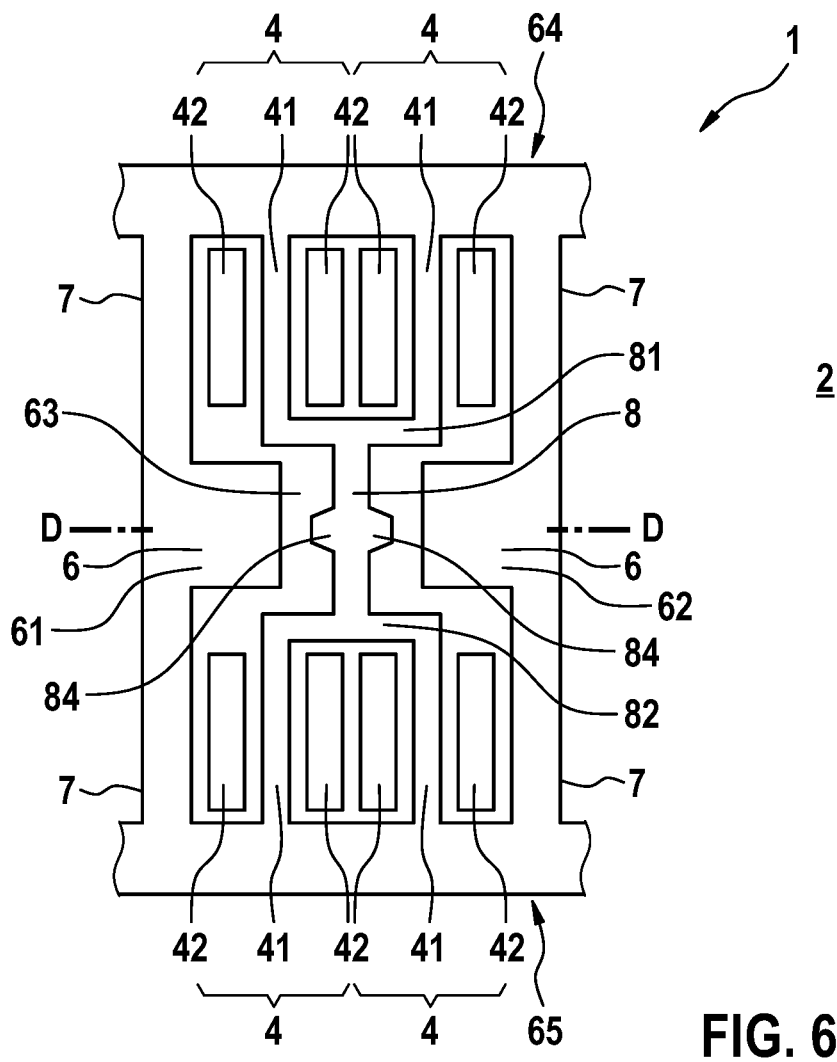
FIG. 6 shows a top view onto a further micromechanical structure.
FIG. 7 shows a cross-section of the micromechanical structure of FIG. 6.

FIG. 6 shows a top view onto a section of a further micromechanical structure 1, which corresponds to micromechanical structure 1 of FIGS. 1 through 3, unless differences are described hereafter. FIG. 7 shows a cross-section through micromechanical structure 1 of FIG. 6 at the intersecting line denoted in FIG. 6 by D. In particular, inner areas 35 are shown in FIG. 6. In outer areas 34, micromechanical structure 1 may, in particular, be identical to micromechanical structure 1 of FIGS. 1 through 3. Connecting element 8 includes two second elevations 84. As a result of second elevations 84, a distance between connecting element 8 and anchoring element 6 is decreased, compared to areas outside second elevations 84. Second elevations 84 are used to prevent seismic mass 3 from striking against substrate 2, or at least make it more difficult, if seismic mass 3 is moved in first direction 11 due to a force acting on micromechanical structure 1. In particular, a planar striking of connecting element 8 against anchoring element 6 is to be prevented or at least made more difficult. It is also possible for more than two second elevations 84 or only one second elevation 84 to be provided. As an alternative, connecting element 8 and first electrodes 41 may also include the features described in connection with FIGS. 4 and 5.

In contrast to the representation of FIG. 7, torsion spring sections 7 may also be configured in such a way that torsion spring sections 7 have the same extension in third direction 13 as first electrodes 41.

Second elevations 84 shown in FIGS. 6 and 7 may be provided as an alternative or in addition to first elevation 83 described in connection with FIG. 5. If only first elevations 83 or only second elevations 84 are provided, these may also in general be referred to as elevations 83 or elevations 84.

Figure 8:
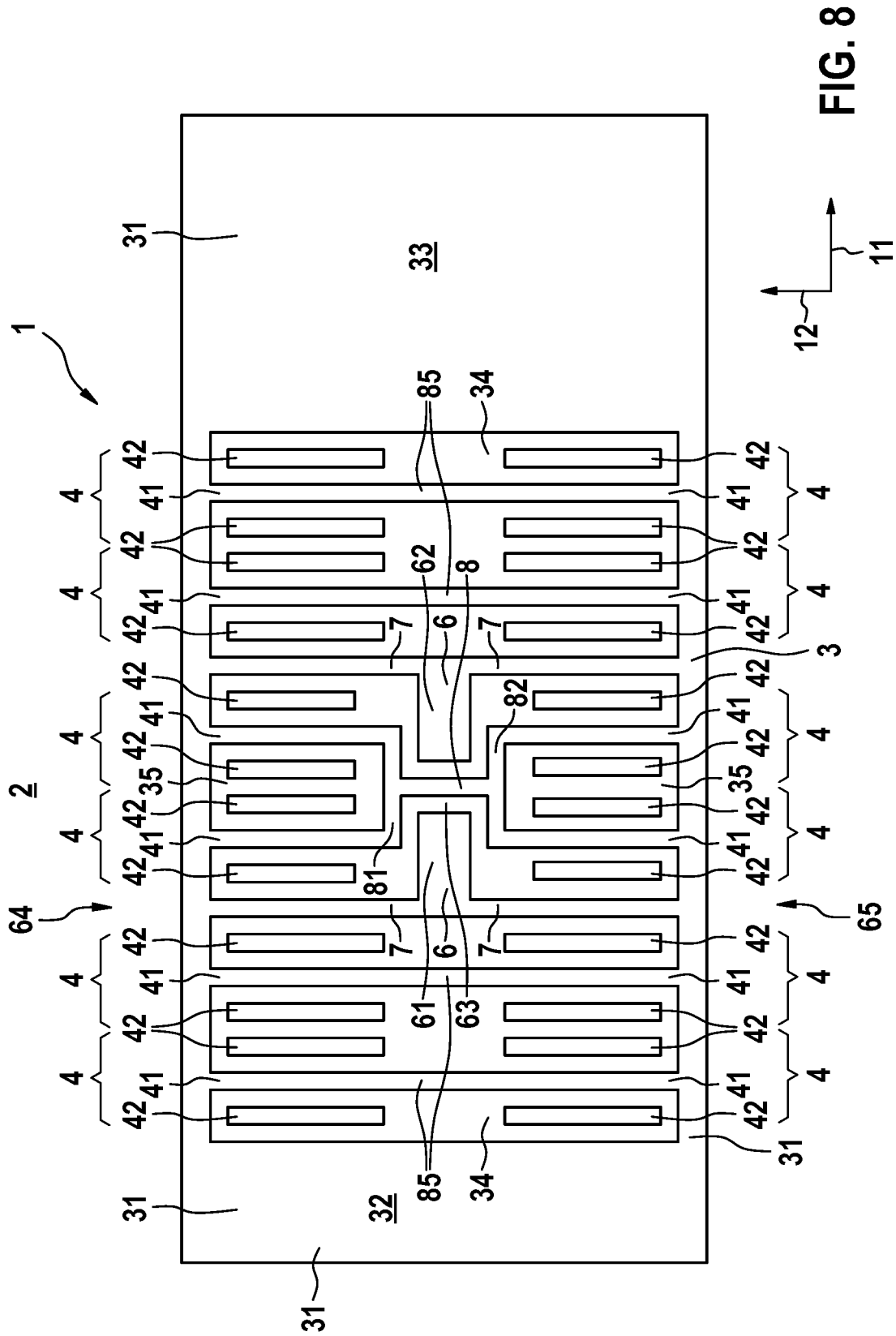
FIG. 8 shows a top view onto a further micromechanical structure, in accordance with an example embodiment of the present invention.

FIG. 8 shows a top view onto a section of a further micromechanical structure 1, which corresponds to micromechanical structure 1 of FIGS. 1 through 3, unless differences are described hereafter. Further connecting elements 85, which each connect two first electrodes 41 to one another, are situated between first electrodes 41 in outer areas 34. In this way, a mechanical stability of micromechanical structure 1 is further increased. The embodiment of connecting element 8 may be as is described in connection with FIGS. 1 to 7. Further connecting elements 85 may include first elevations 83, as is described in connection with FIG. 5.

Micromechanical structure 1 may be made of silicon. In particular, electrodes 41, 42, 53, 54 may also be made of silicon, in particular, made of doped silicon. For manufacturing the micromechanical structure 1, it may be provided to situate silicon and silicon oxide in layers in such a way that, after the silicon oxide has been removed, for example with the aid of an etching process, the described micromechanical structure 1 made of silicon remains.

Figure 9:
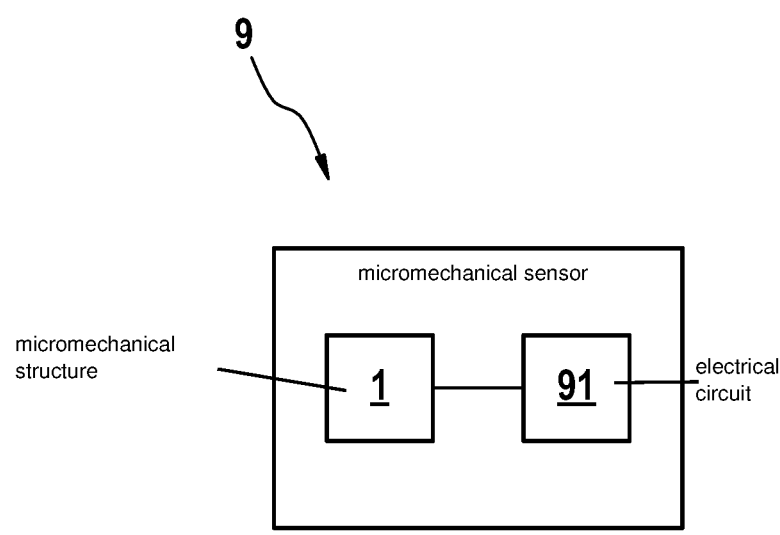
FIG. 9 shows a micromechanical sensor, in accordance with an example embodiment of the present invention.

FIG. 9 shows a micromechanical sensor 9 including a micromechanical structure described in FIGS. 1 through 8. Micromechanical sensor 9 furthermore includes an electrical circuit 91, with the aid of which detection means 4, 5 may be read out. In particular, electrical circuit 91 may be configured to evaluate a first capacitor, formed by first electrodes 41 and second electrodes 42, with respect to a changing capacitance, and to evaluate a second capacitor, formed by third electrodes 53 and fourth electrodes 54, with respect to a changing capacitance.

Although the present invention was described in detail by the preferred exemplary embodiments, the present invention is not limited to the described examples, and other variations may be derived therefrom by those skilled in the art without departing from the scope of protection of the present invention.

What is claimed is:

1. A micromechanical structure, comprising:
a substrate;
a seismic mass movable with respect to the substrate;
a first detector; and
a second detector;
wherein a first direction and a second direction, which is perpendicular to the first direction, define a main extension plane of the substrate, the first detector is configured for detecting a translatory deflection of the seismic mass in the first direction, and the second detector is configured for detecting a rotatory deflection of the seismic mass about a rotation axis, the rotation axis being situated in the second direction;
wherein the seismic mass is connected to the substrate via an anchoring element and four torsion spring sections situated along the second direction, the first detector includes an electrode structure including first electrodes attached at the seismic mass and second electrodes attached at the substrate, the first electrodes and the second electrodes having a two-dimensional extension in the second direction and in a third direction, the third direction being perpendicular to the main extension plane, the anchoring element including a first section and a second section, a gap being provided between the first section and the second section in the first direction, a connecting element connecting two of the first electrodes, and the connecting element being guided through the gap in the second direction,
wherein the connecting element includes at least one first elevation, a distance between the connecting element and the substrate being decreased in an area of the first elevation, compared to a distance between the connecting element and the substrate outside the first elevation.

2. The micromechanical structure as recited in claim 1, wherein multiple ones of the first electrodes are situated on a first side of the anchoring element, and multiple ones of the first electrodes are situated on a second side of the anchoring element situated opposite the first side, a first transverse structure connecting the multiple ones of the first electrodes on the first side to the connecting element, and a second transverse structure connecting the multiple ones of the first electrodes on the second side to the connecting element.

3. The micromechanical structure as recited in claim 1, wherein the connecting element includes at least one second elevation, a distance between the connecting element and the anchoring element being decreased in an area of the second elevation, compared to a distance between the connecting element and the anchoring element outside the second elevation.

4. The micromechanical structure as recited in claim 1, wherein the seismic mass includes a frame, the torsion spring sections abut the frame and the anchoring element, and the first electrodes abut the frame.

5. The micromechanical structure as recited in claim 4, wherein two outer areas and two inner areas are formed by the torsion spring sections, the anchoring element, and the frame, the outer areas each being situated between the frame and two of the torsion spring sections, the inner areas each being situated between two of the torsion spring sections, the frame, and the anchoring element, and the connecting element connects the first electrodes, which are each situated in one of the inner areas, to one another.

6. The micromechanical structure as recited in claim 4, wherein the frame has an asymmetrical mass distribution, based on the anchoring element and the torsion spring sections, in the first direction.

7. The micromechanical structure as recited in claim 4, wherein the second detector includes a third electrode situated at the frame and a fourth electrode situated at the substrate.

8. A micromechanical sensor, comprising:
a micromechanical structure, including:
a substrate,
a seismic mass movable with respect to the substrate,
a first detector, and
a second detector,
wherein a first direction and a second direction, which is perpendicular to the first direction, define a main extension plane of the substrate, the first detector is configured for detecting a translatory deflection of the seismic mass in the first direction, and the second detector is configured for detecting a rotatory deflection of the seismic mass about a rotation axis, the rotation axis being situated in the second direction,
wherein the seismic mass is connected to the substrate via an anchoring element and four torsion spring sections situated along the second direction, the first detector includes an electrode structure including first electrodes attached at the seismic mass and second electrodes attached at the substrate, the first electrodes and second electrodes having a two-dimensional extension in the second direction and in a third direction, the third direction being perpendicular to the main extension plane, the anchoring element including a first section and a second section, a gap being provided between the first section and the second section in the first direction, a connecting element connecting two of the first electrodes, and the connecting element being guided through the gap in the second direction, and
an electrical circuit configured to read out the first detector and the second detector,
wherein the connecting element includes at least one first elevation, a distance between the connecting element and the substrate being decreased in an area of the first elevation, compared to a distance between the connecting element and the substrate outside the first elevation.

9. The micromechanical sensor as recited in claim 8, wherein the electrical circuit is configured to ascertain a first capacitance of a first capacitor formed of at least one of the first electrodes and at least one of the second electrodes, and a second capacitance of a second capacitor formed of at least one third electrode and at least one fourth electrode.

\* \* \* \* \*